United States Patent
Kim

(10) Patent No.: US 12,538,460 B2
(45) Date of Patent: Jan. 27, 2026

(54) HEAT SINK FOR ELECTRIC MACHINE

(71) Applicant: LS ELECTRIC CO., LTD., Anyang-si (KR)

(72) Inventor: Seong Eon Kim, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 218 days.

(21) Appl. No.: 18/273,931

(22) PCT Filed: Dec. 15, 2021

(86) PCT No.: PCT/KR2021/019075
§ 371 (c)(1),
(2) Date: Jul. 24, 2023

(87) PCT Pub. No.: WO2022/164021
PCT Pub. Date: Aug. 4, 2022

(65) Prior Publication Data
US 2024/0298428 A1    Sep. 5, 2024

(30) Foreign Application Priority Data

Jan. 28, 2021 (KR) .................. 10-2021-0011962

(51) Int. Cl.
*H05K 7/20* (2006.01)
(52) U.S. Cl.
CPC ..... *H05K 7/20927* (2013.01); *H05K 7/20254* (2013.01)
(58) Field of Classification Search
CPC .................. H05K 7/20254; H05K 7/20927

USPC .............. 165/80.4, 170, 162, 152, 166
See application file for complete search history.

(56) References Cited

U.S. PATENT DOCUMENTS

| | | | |
|---|---|---|---|
| 7,819,174 B2 * | 10/2010 | Huang | F28D 15/0266 165/80.4 |
| 8,835,038 B2 * | 9/2014 | Abels | H01M 10/647 429/120 |
| 8,933,557 B2 * | 1/2015 | Gohara | H01L 23/473 165/185 |

(Continued)

FOREIGN PATENT DOCUMENTS

| | | | |
|---|---|---|---|
| JP | 2007294891 A | 11/2007 | |
| JP | 2014143273 A | 8/2014 | |

(Continued)

OTHER PUBLICATIONS

International Search Report for related International Application No. PCT/KR2021/019075; action dated Aug. 4, 2022; (2 pages).

(Continued)

*Primary Examiner* — Claire E Rojohn, III
(74) *Attorney, Agent, or Firm* — K&L Gates LLP

(57) ABSTRACT

The present disclosure relates to a heat sink for an electric machine and, more specifically, to a heat sink for an electric semiconductor element used in an electric module, and the present invention is characterized by; comprising a cooling plate having an inlet and an outlet; having a tank which is formed in a plate shape inside the cooling plate and forms a coolant flow path connected to the inlet and the outlet, and having multiple collision pillars continuing from the top surface to the base surface of the tank formed in the tank.

11 Claims, 10 Drawing Sheets

(56) References Cited

U.S. PATENT DOCUMENTS

| | | | |
|---|---|---|---|
| 9,414,525 B2* | 8/2016 | Campbell | H05K 7/20772 |
| 9,613,885 B2* | 4/2017 | Yoo | H01L 21/4882 |
| 9,743,562 B2* | 8/2017 | Desiano | H05K 7/20409 |
| 9,845,999 B2* | 12/2017 | Matsushima | B23P 11/00 |
| 10,014,236 B2* | 7/2018 | Adachi | H01L 23/473 |
| 10,215,504 B2* | 2/2019 | Coteus | H01L 23/473 |
| 10,388,589 B2* | 8/2019 | Kawase | H01L 25/072 |
| 10,594,004 B2* | 3/2020 | Dudley | H01M 10/6556 |
| 10,619,948 B2* | 4/2020 | Ideguchi | H01L 21/4882 |
| 10,827,647 B2* | 11/2020 | Lin | F28F 3/12 |
| 10,986,754 B2* | 4/2021 | Lee | H05K 1/0204 |
| 10,993,351 B2* | 4/2021 | Tang | H05K 7/20154 |
| 10,999,955 B2* | 5/2021 | Wecker | H05K 7/20872 |
| 11,003,227 B2* | 5/2021 | Sakata | H01L 21/4878 |
| 11,015,872 B2* | 5/2021 | Aston | H05K 7/20254 |
| 11,224,146 B2* | 1/2022 | Langenfeld | H05K 7/20863 |
| 11,284,534 B2* | 3/2022 | Yamaguchi | H05K 7/20272 |
| 11,473,860 B2* | 10/2022 | Holden | F28F 27/00 |
| 11,561,050 B2* | 1/2023 | Huang | F28D 15/046 |
| 11,937,403 B2* | 3/2024 | Ahmadi | H01L 23/3672 |
| 11,965,702 B1* | 4/2024 | Hsiung | F28D 1/0316 |
| 12,219,733 B2* | 2/2025 | Bauduin | H01L 23/473 |
| 2007/0227697 A1* | 10/2007 | Takahashi | H01L 23/473 |
| | | | 257/E23.098 |
| 2011/0024091 A1* | 2/2011 | Kim | F28F 3/042 |
| | | | 165/104.33 |
| 2013/0112388 A1* | 5/2013 | Kwak | H05K 7/20254 |
| | | | 165/185 |
| 2013/0343001 A1* | 12/2013 | Kwak | H01L 23/473 |
| | | | 165/104.11 |
| 2015/0107801 A1* | 4/2015 | Campbell | H05K 7/2039 |
| | | | 165/104.19 |
| 2017/0235350 A1* | 8/2017 | Tsai | G06F 1/20 |
| | | | 165/80.4 |
| 2020/0075452 A1* | 3/2020 | Matsuzawa | H01L 23/3677 |
| 2023/0217629 A1* | 7/2023 | Amos | H05K 7/20236 |
| | | | 165/80.4 |
| 2023/0314092 A1* | 10/2023 | Ranjan | H01L 23/473 |
| 2023/0397376 A1* | 12/2023 | Heydari | H05K 7/20509 |
| 2024/0260229 A1* | 8/2024 | Huang | H05K 7/20272 |
| 2024/0298428 A1* | 9/2024 | Kim | H01L 23/367 |
| 2025/0071937 A1* | 2/2025 | Zakaib | H05K 7/20254 |

FOREIGN PATENT DOCUMENTS

| | | |
|---|---|---|
| KR | 101278313 B1 | 6/2013 |
| KR | 101540146 B1 | 7/2015 |
| KR | 20180131140 A | 12/2018 |

OTHER PUBLICATIONS

Written Opinion for related International Application No. PCT/KR2021/019075; action dated Aug. 4, 2022; (4 pages).

* cited by examiner

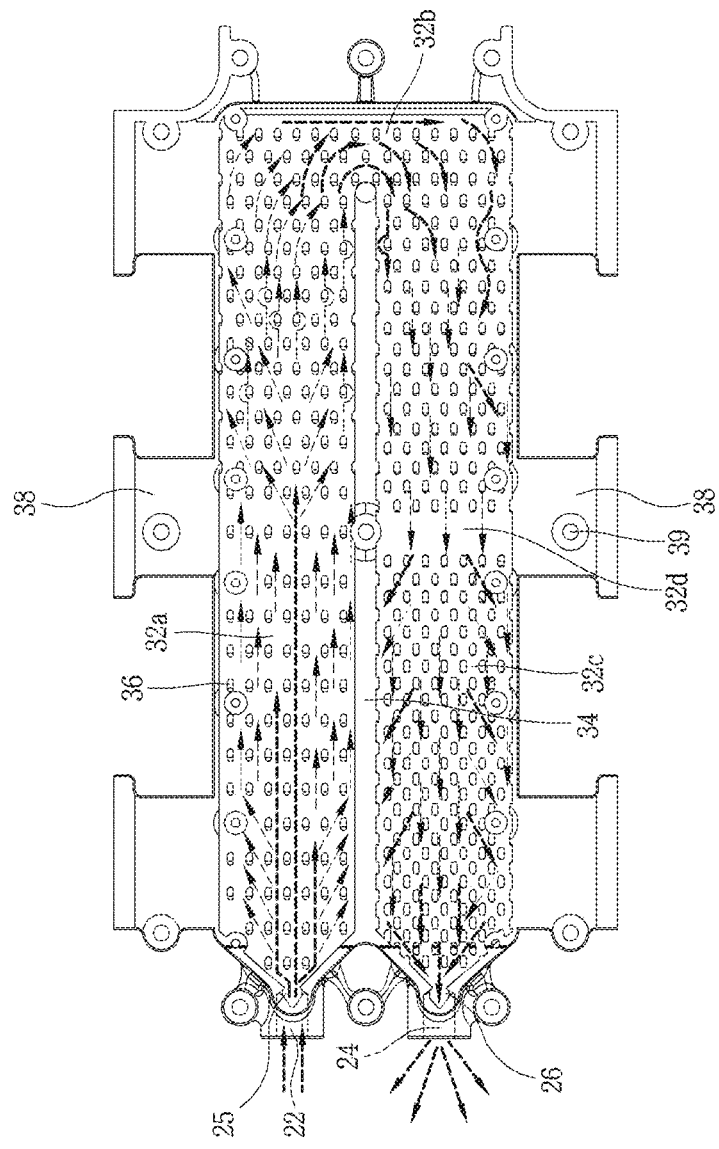

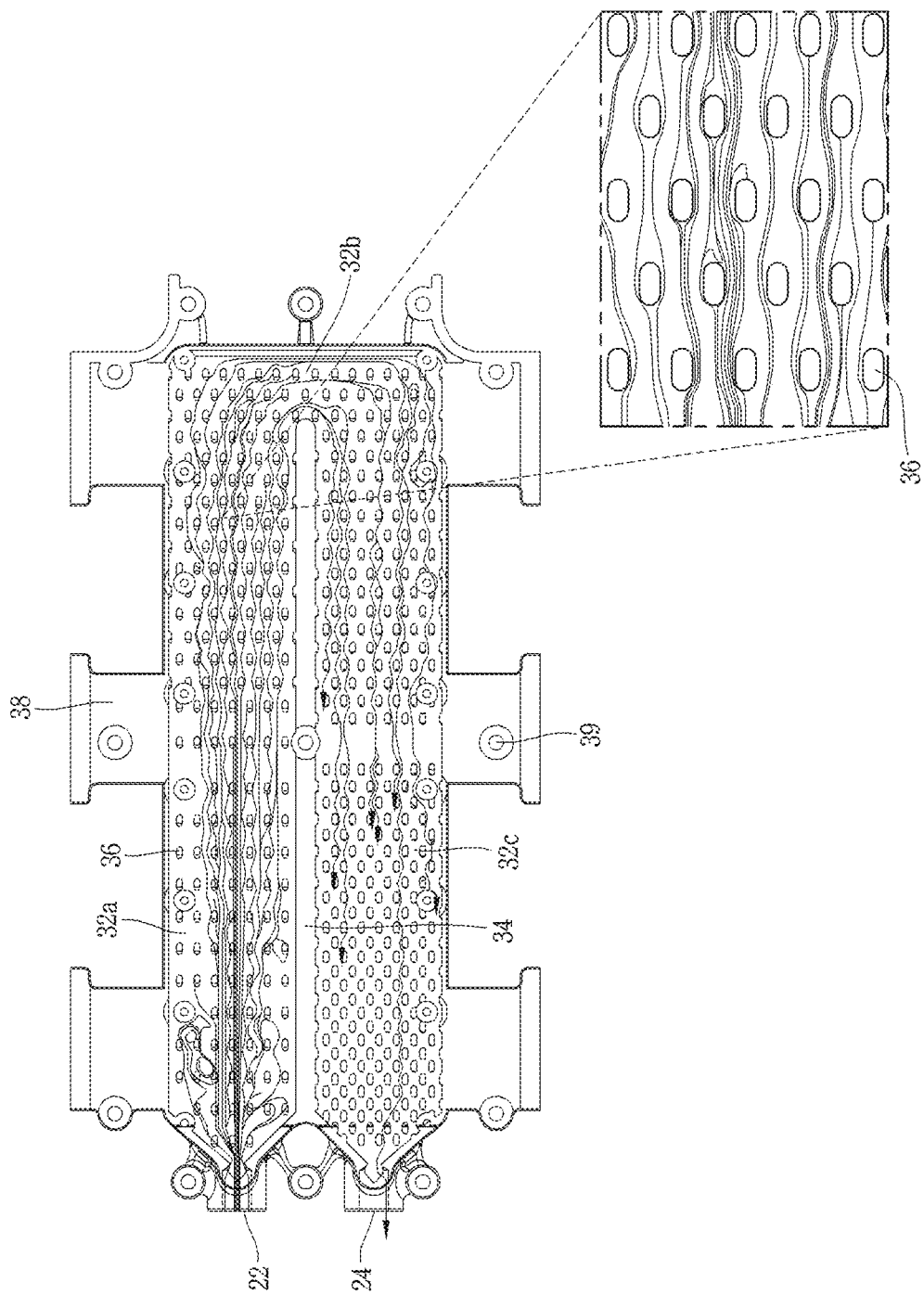

HEAT SINK FOR ELECTRIC MACHINE

CROSS-REFERENCE TO RELATED APPLICATION

This application is a National Stage of International Application No. PCT/KR2021/019075, filed on Dec. 15, 2021, which claims priority to and the benefit of Korean Patent Application No. 10-2021-0011962, filed on Jan. 28, 2021, the disclosure of which is incorporated herein by reference in its entirety.

FIELD

The present disclosure relates to a heat sink for a power device, and more particularly, to a heat sink for a power semiconductor device used in a power module.

BACKGROUND

In general, a flexible AC transmission system (FACTS) refers to a power transport method that enables high-capacity power transport and system safety improvement at the same time by actively controlling the flow of electricity using a semiconductor device. The flexible transmission system is a power system technology that improves the flexibility and efficiency of facility use by supplementing the disadvantages of the AC power system by being connected in series/parallel to the power system.

Effects of adopting flexible transmission system technology include increase in transmission capacity due to expansion of power system control range, suppression of system fluctuations that can limit transmission capacity or cause equipment failure, control of system stabilization, and suppression of ripple effects of system accidents and equipment failures. In addition, the flexible power transmission system plays a role of supplementing reactive power lost during transmission and distribution. The flexible power transmission system improves productivity by suppressing voltage fluctuations and maintaining high-quality electricity through power factor control.

The flexible power transmission system has advanced from the first generation technology using passive elements such as mechanical circuit breakers, capacitors, and reactors, and recently advanced reactive power compensation devices are used by combining power semiconductor elements and new technologies. These reactive power compensators are SVC and STATCOM and ect.

SVC (Static Var Compensator) is a parallel stationary reactive power compensation facility using a thyristor semiconductor element. It replaces the previously used capacitor bank for power factor correction with TSC (Thyristor Switched Capacitor) and the reactor bank with TCR (Thyristor Controlled Reactor). It is one of the representative types of parallel flexible power transmission system that improves power quality and system stability.

STATCOM (STATic synchronous COMpensator) uses voltage type MMC (Modular Multi-level Converter) technology to which the latest high-voltage, high-power IGBT (Insulated Gate Bipolar Transistor) is applied, and has faster response speed than SVC system. In addition, it has been widely used recently with the advantages of reduced area and low harmonic generation.

FIG. 1 shows the main configuration of the STATCOM system according to the prior art. The main components include a transformer (STATCOM Transformer, 1), a disconnector switch 2, a phase reactor 3, a control and protection 4 and etc. Here, the control and protection panel 4 is also called MMC Valve (Modular Multi-level Converter Valve).

This MMC Valve 4 comprises IGBT 5 which a semiconductor power electronic device that controls current as a major component. Since this IGBT 5 and power semiconductor devices must be managed below a certain temperature, a cooling system must be provided. A heat sink 6 is essential for this cooling system.

Heat sinks can be largely divided into air-cooled and water-cooled. In the case of air-cooled, the volume of the heat sink, and furthermore, the volume of the entire system increases exponentially in order to smoothly cool the power semiconductor device that generates heat in units of kW. Therefore, a heat sink for a power semiconductor device must be practically water-cooled, and a configuration for increasing cooling efficiency is required.

FIG. 2 shows a heat sink 6 applied to a flexible power transmission system according to the prior art. The heat sink 6 is composed of a base plate 6a and a cover plate 6b, and a meandering coolant flow path 6c is provided in the base plate 6a.

Here, a fin (not shown) is formed in the coolant flow path 6c to increase heat exchange capability.

However, since the number of fins for increasing the cross-sectional area within a given volume is limited, a more efficient design is required to improve cooling performance.

SUMMARY

The present disclosure has been made to solve the above problems, and its object is to provide a heat sink with improved cooling efficiency.

Technical Solution

The present embodiment comprising a cooling plate having an inlet and an outlet, wherein a water tank formed in a plate shape inside the cooling plate and forming a coolant flow path connected to the inlet and the outlet, wherein a plurality of collision pillars leads to the upper and lower surfaces of the tank is formed in the water tank.

The cooling plate comprises a first plate and a second plate spaced apart from each other at a predetermined interval.

A ventilation layer is provided between the first plate and the second plate.

A branch pipe branching to the first plate and the second plate is at each a rear of the inlet and the outlet One of an upper part and a lower part of a first water tank of the first plate disposed above the cooling plate is formed thinner than the other, and one of an upper part and a lower part of a second water tank of the second plate disposed below the cooling plate is formed thinner than the other.

The water tank is formed with a partition wall portion separating the coolant flow path into an inlet-side flow path and an outlet-side flow path.

A density of the collision pillar is arranged to gradually become denser along the coolant flow path.

A n-th of the collision pillar and a n−1-th of the collision pillar are arranged to cross each other when viewed from a front or top.

The n-th of the collision pillar and the n−1-th of the collision pillar are disposed uniformly without crossing each other in a front portion of the inlet-side flow path A non-collision zone in which the collision pillar is not disposed is provided in a middle portion of the outlet-side flow path A support portion protrudes from a side surface of the cooling plate, and a fastening hole is formed through the support portion.

A connection support portion is provided between the first plate and the

A through-hole is formed in the connection support portion.

Advantageous Effect

According to the heat sink for power device according to the present embodiment, the coolant flow path is formed in a plate shape, so that the occupied space per unit area is increased. That is, the flow rate of the coolant flow path is formed in a planar shape, a coolant flow rate is increased in the unit volume compared to the prior art in which the coolant flow path is formed in a linear shape.

The cooling plates comprises two cooling plates spaced apart from each other by a predetermined distance, and are respectively responsible for cooling two adjacent power devices.

Since a ventilation layer is provided between the two cooling plates, both the water cooling type and the air cooling type are used.

A collision pillar is provided in the coolant flow path so that mixing occurs while forming a vortex in the coolant. That is, thermal mixing is well achieved.

Since the number (density) of collision pillar per unit area gradually increases from the inlet side to the outlet side, a decrease in the entry speed of the coolant is prevented at the inlet side, and heat mixing is well performed by mixed flow at the outlet side.

The coolant flow path is arranged close to the power device to increase the cooling effect.

A connection support is provided between the two cooling plates to support and transfer heat.

BRIEF DESCRIPTION OF THE DRAWINGS

FIG. 9 illustrates a flow velocity distribution in a heat sink for a power device according to an embodiment of the present disclosure.

FIG. 10 illustrates a wire in a heat sink for a power device according to an embodiment of the present disclosure.

DETAILED DESCRIPTION

Hereinafter, preferred embodiments of the present disclosure will be described with reference to the accompanying drawings, which are intended to be described in detail so that those skilled in the art can easily practice the disclosure. It does not mean that the technical spirit and scope of the disclosure are limited.

Figure 1:
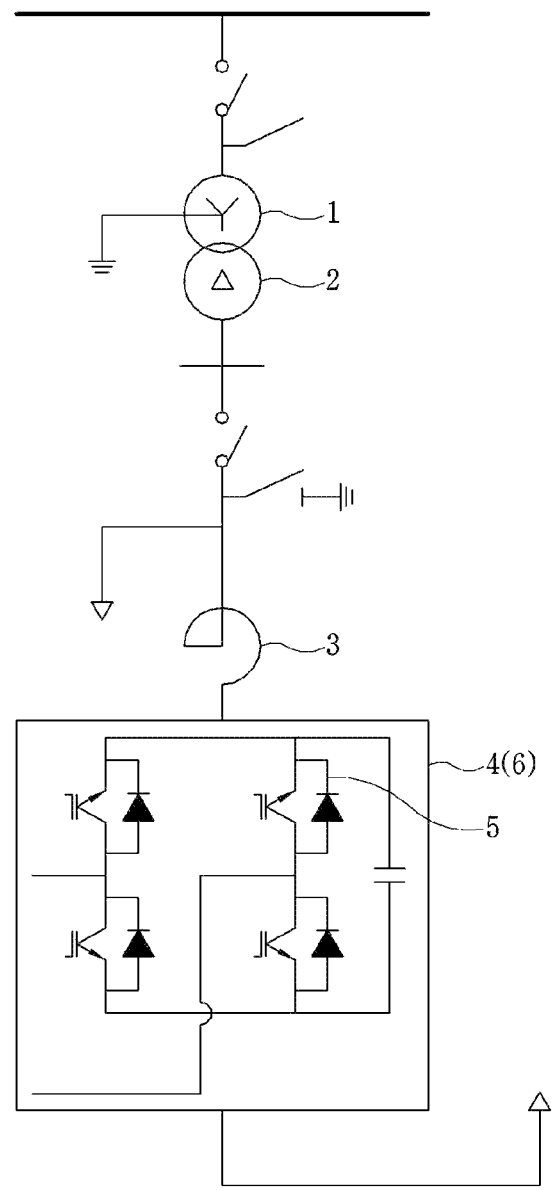
FIG. 1 is a main configuration view of a STATCOM system among flexible power transmission systems according to the prior art.
Figure 2:
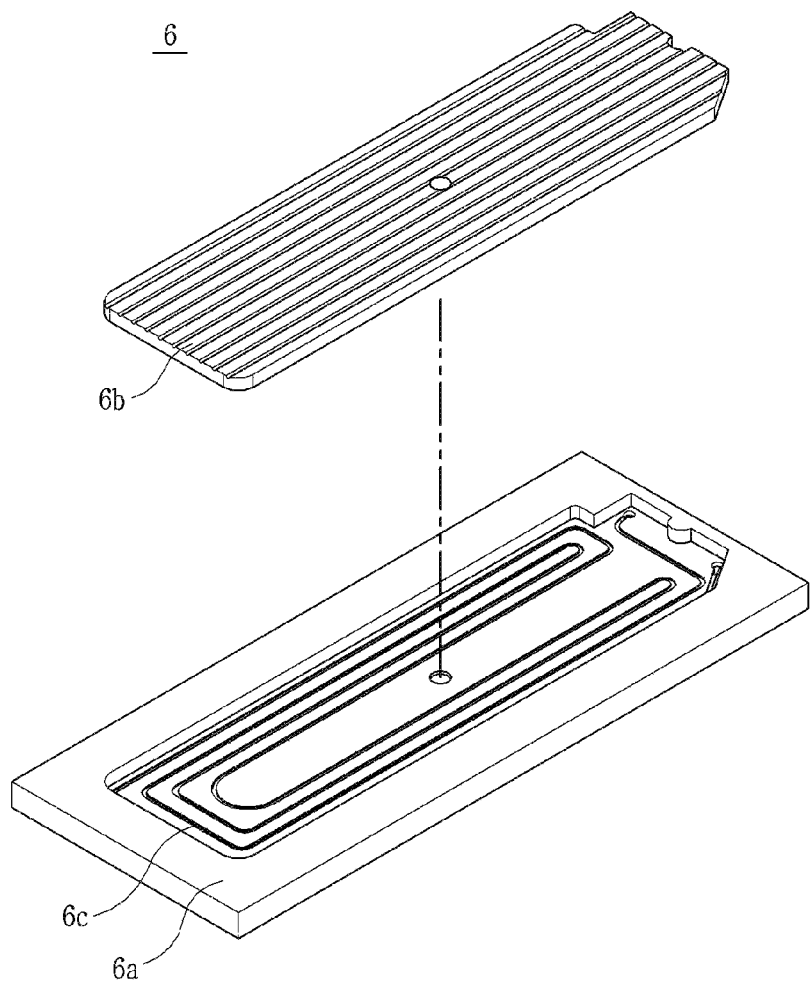
FIG. 2 is a perspective view of a heat sink of the cooling system applied to FIG. 1.
Figure 3A:
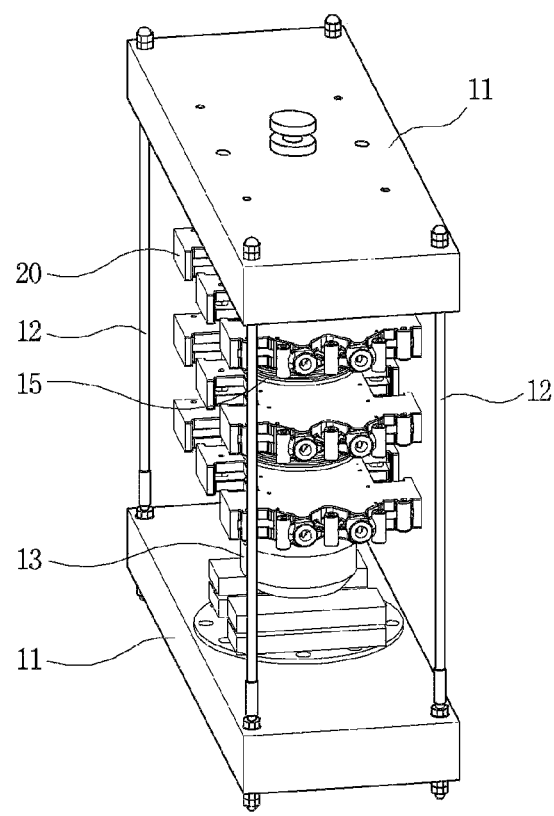
FIGS. 3A and 3B are perspective views of a power device module to which a heat sink according to an embodiment of the present disclosure is applied, respectively.
Figure 3B:
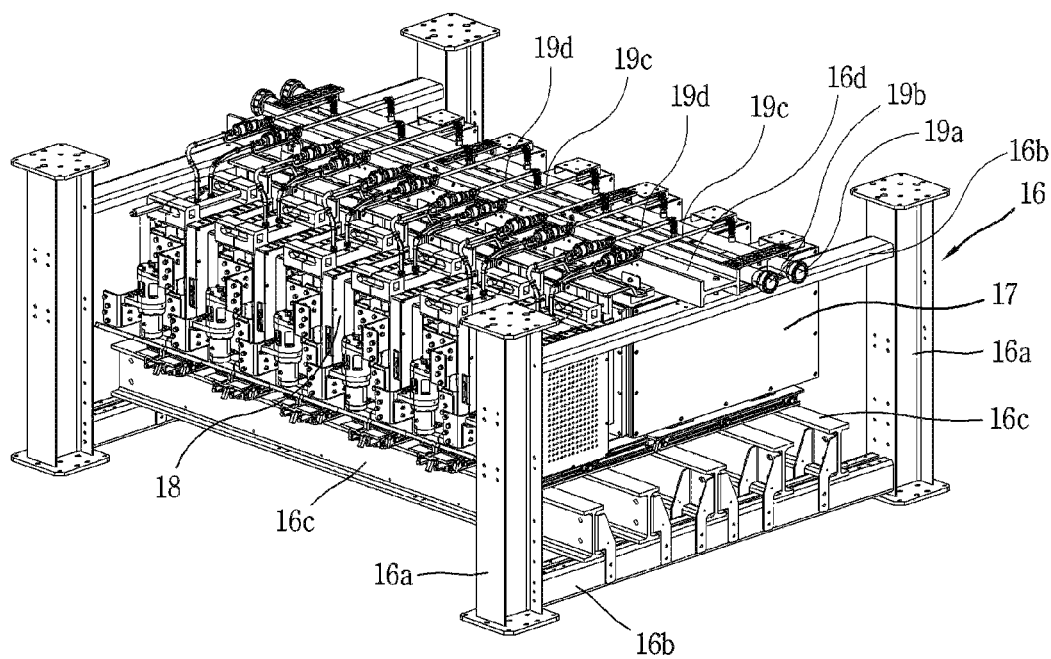
Figure 4:
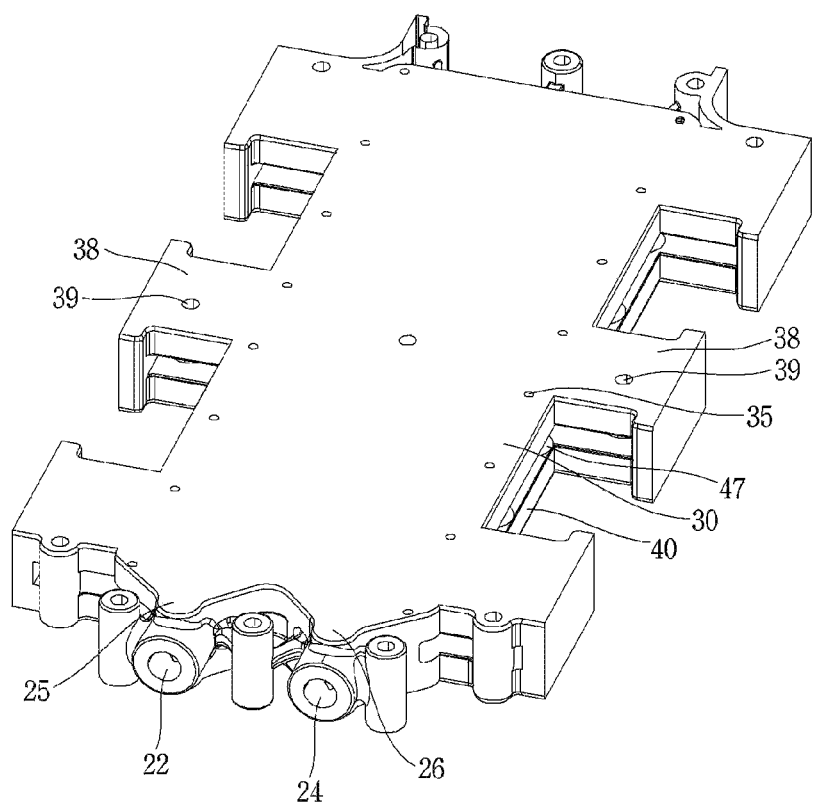
FIG. 4 is a perspective view of a heat sink for a power device according to an embodiment of the present disclosure.
Figure 5:
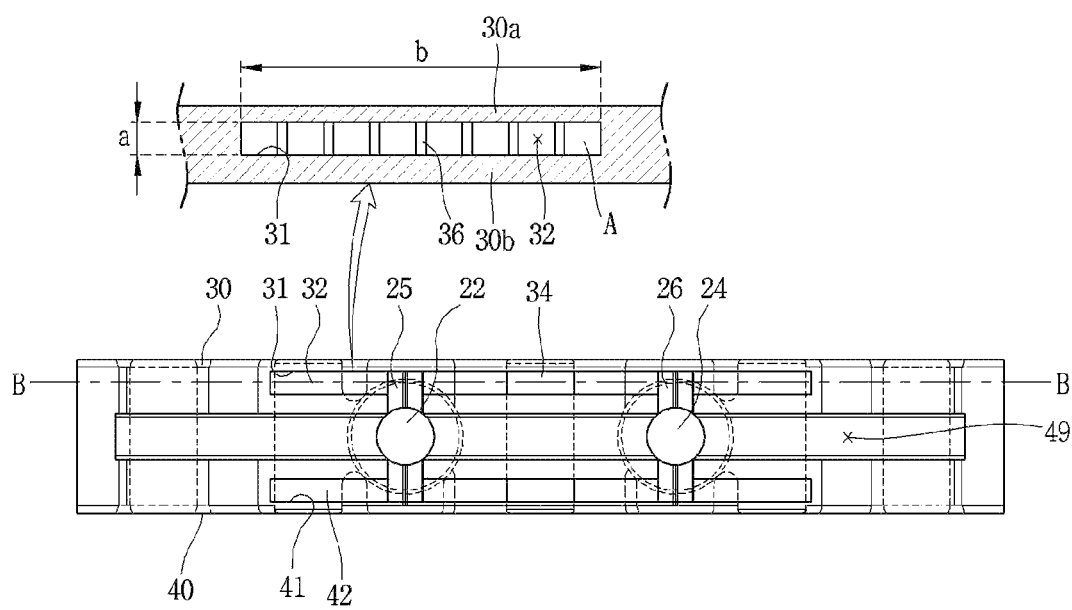
FIGS. 5, 6, and 7 are a front perspective view, a right perspective view, and a top perspective view of FIG. 4, respectively.
Figure 6:
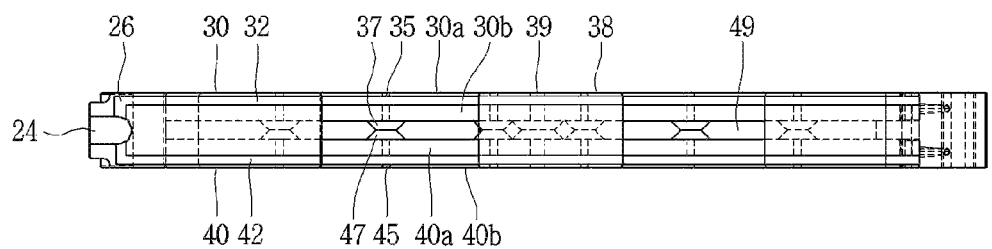
Figure 7:
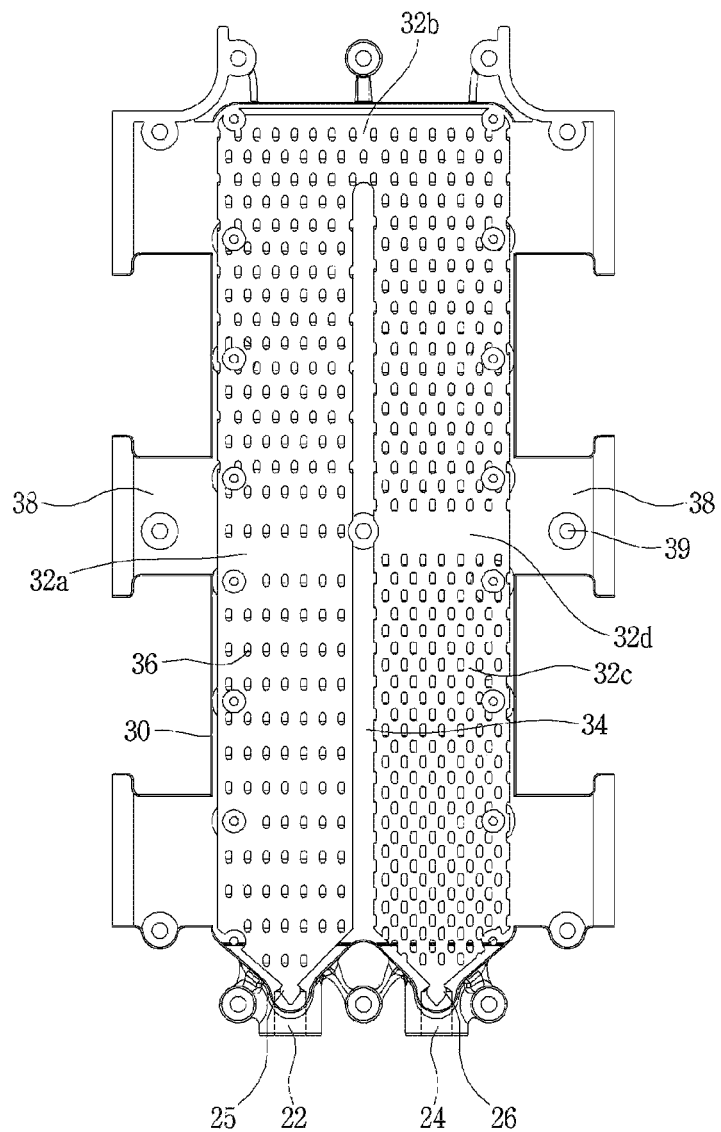
Figure 8:
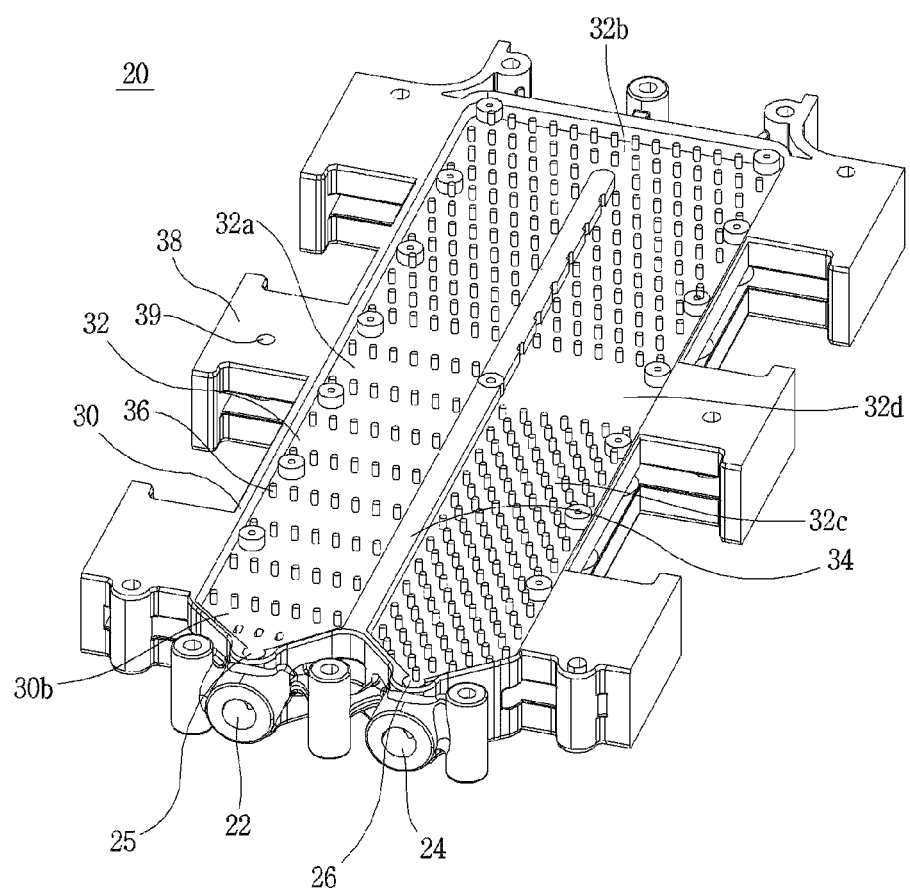
FIG. 8 is a perspective view of a part B-B cut away in FIG. 5.

FIGS. 3A and 3B are perspective views of a power device module to which a heat sink according to an embodiment of the present disclosure is applied, respectively; FIG. 4 is a perspective view of a heat sink for a power device according to an embodiment of the present disclosure; FIGS. 5, 6, and 7 are a front perspective view, a right perspective view, and a top perspective view of FIG. 4, respectively; and FIG. 8 is a perspective view of a part B-B cut away in FIG. 5. A heat sink for a power device according to each embodiment of the present disclosure will be described in detail with reference to the drawings.

A heat sink for power device according to an embodiment of the present disclosure comprises cooling plates 30 and 40 having an inlet 22 and an outlet 24, and water tanks 31 and 41 formed in a plate shape and forming coolant flow paths 32 and 42 connected to the inlet 22 and the outlet 24 are provided in the inside of the cooling plates 30 and 40, and a plurality of collision pillars 36 leads upper and lower surfaces is in the water tanks 31 and 41

A heat sink for power devices according to an embodiment of the present disclosure is used for power devices or power facilities. An example of such a power facility is a flexible power transmission system.

SVC (Static Var Compensator), a type of flexible power transmission system, is a parallel stationary reactive power compensation facility using a thyristor semiconductor element. It replaces the previously used capacitor bank for power factor correction with TSC (Thyristor Switched Capacitor) and the reactor bank with TCR (Thyristor Controlled Reactor). It is one of the representative types of parallel flexible power transmission system that improves power quality and system stability.

FIG. 3A shows a power device module 10 constituting an SVC thyristor valve. The power device module 10 is provided with a pair of supports 11 composed of a frame or a plate and a support pillar 12 connected between the pair of supports 11.

Meanwhile, a power semiconductor device 15 such as IGBT and a heat sink 20 are alternately stacked between the pair of supports 11. A support or variable support 13 may be provided between the support 11 disposed below and the heat sink 20.

Also, as another type of flexible transmission system, the STATCOM system is used in substations and the like. The main components of the STATCOM system comprises a transformer, a disconnector switch, a phase reactor, and control and protection panel, etc. Here, the control and protection panel is also called MMC Valve (Modular Multilevel Converter Valve).

This MMC Valve comprises IGBT which a semiconductor power electronic device that controls current as a major component. Since this IGBT and power semiconductor devices must be managed below a certain temperature, a cooling system must be provided. A heat sink is essential for this cooling system.

A power device module 10A constituting such an MMC Valve is shown in FIG. 3B.

The power device module 10A is supported by a plurality of frames 16. The frame 16 comprises a vertical frame 16a, a horizontal frame 16b, a support portion 16c and a fixed frame 16d.

A capacitor unit 17 and a valve assembly 18 are installed on the frame 16. A heat sink 20 is inserted and installed in the valve assembly 18 for cooling.

A coolant supply pipe 19a and a coolant recovery pipe 19b are provided on the upper portion of the frame 16. Coolant is supplied and circulated to the inlet 22 and outlet 24 of each heat sink 20 through the branch pipes 19c and 19d connected to the coolant supply pipe 19a and the coolant recovery pipe 19b, respectively.

The heat sink 20 has cooling plates 30 and 40. The cooling plates 30 and 40 comprises an upper plate 30 (or first plate) and a lower plate 40 (or second plate) spaced apart from each other at a predetermined interval. The upper plate 30 is in contact with the power semiconductor device 15 disposed thereon, and the lower plate 40 is in contact with the power semiconductor device 15 disposed therebelow. Accordingly, the upper plate 30 mainly serves to cool the power semiconductor device 15 adjacent to the upper portion, and the lower plate 40 mainly serves to cool the power semiconductor device 15 adjacent to the lower portion. That is, the cooling of the power semiconductor element 15 and the cooling of the lower plate 40 responsible for cooling the power semiconductor element 15 are separated, the cooling effect is greater than that of a heat sink having a single plate.

Since the upper plate 30 and the lower plate 40 are spaced apart from each other at a predetermined interval, a ventilation layer 49 is provided between the upper plate 30 and the lower plate 40. Therefore, the power semiconductor device 15 has a cooling structure in which a water cooling type and an air cooling type are combined because heat is dissipated by the ventilation layer 49 in addition to being in contact with the cooling plates 30 and 40 where the coolant flow paths described later are formed.

The cooling plates 30 and 40 have an inlet 22 and an outlet 24. Coolant flows in from the inlet 22, passes through the coolant channels 32 and 42, exchanges heat with the power semiconductor device 15, and exits through the outlet 24. The upper plate 30 and the lower plate 40 share an inlet 22 and an outlet 24. That is, at the rear of the inlet 22 and the outlet 24, branch pipes branching to the water tanks 31 and 41 of the upper plate 30 and the lower plate 40 are respectively provided. An intake branch pipe 25 is provided at the rear of the inlet 22, and a water outlet branch pipe 26 is provided at the rear of the water outlet 24.

'U'-shaped coolant flow paths 32 and 42 extending from the inlet 22 to the outlet 24 are formed in the cooling plates 30 and 40.

In the present disclosure, since the upper plate 30 and the lower plate 40 are symmetrical in structure and have similar structures and functions, the description of the upper plate 30 also applies to the lower plate 40. That is, a description of the lower plate 40 will not be separately made for the same matters as the upper plate 30.

In addition, the distinction words of 'upper' and 'lower' applied in the present disclosure may be converted into 'first' and 'second'.

The coolant flow paths 32 and 42 formed in the cooling plates 30 and 40 are formed by water tanks 31 and 41 formed in the cooling plates 30 and 40 as spaces having a predetermined volume. That is, a waterway, which is an empty space through which coolant can flow, is formed in the cooling plates 30 and 40, and in the present disclosure, the waterway is formed in the form of a plate-shaped water tank. That is, as shown in FIG. 5, the water tanks 31 and 41 may have a rectangular cross section.

The upper plate 30 has a 'U'-shaped upper coolant flow path 32 or a first flow path extending from the water inlet 22 to the water outlet 24. The upper coolant flow path 32 is formed in a plate shape along the upper plate 30. The upper coolant flow path 32 is formed in a plate shape to increase the flow rate per unit area. Thus, the cooling effect is increased. That is, since the cross-sectional area of the upper coolant flow path 32 or the upper water tank 31 corresponds to 'A', the flow rate per unit area is increased compared to a heat sink having a tubular coolant flow path. In other words, the ratio occupied by the coolant flow path per unit area in the heat sink increases, thereby increasing the cooling effect. (See FIG. 5)

Here, the aspect ratio of the cross-sectional area 'A' of the upper coolant flow path 32 or the upper water flow path 31 is preferably set to, for example, 3:1, 5:1, or 10:1 or more. This is to increase the cooling effect by making the horizontal length sufficiently larger than the vertical length to form the plate-shaped flow path.

In the upper plate 30, one of the upper part of the first water tank 31 and the lower part of the first water tank 31 is formed thinner than the other, and in the lower plate 40, one of the upper part of the second water tank 41 and the lower part of the second water tank 41 is formed thinner than the other.

In one embodiment, the space occupied by the upper coolant flow path 32 is disposed biased toward the upper side of the upper plate 30. That is, in the upper plate 30, the upper part 30a of the upper coolant flow path 32 is thinner than the lower part 30b of the upper coolant flow path 32. Accordingly, the upper coolant flow path 32 is disposed closer to the power semiconductor device 15 in contact with the upper surface of the upper plate 30. (See FIG. 6) (In the lower plate 40 formed symmetrically with the upper plate 30, the lower coolant flow path 42 is disposed biased from the lower plate 40 to the lower side. That is, in the the lower plate 40, the lower part 40b of the lower coolant flow path 42 is thinner than the upper part 40a of the lower coolant flow path 42. Accordingly, closer to the power semiconductor element 15 in contact with the lower surface of the lower plate 40.) Since the coolant flow paths 32 and 42 are arranged close to the adjacent power semiconductor elements 15, the cooling effect is increased.

A partition wall portion 34 is formed in the middle portion of the upper plate 30 along the longitudinal direction. The partition wall portion 34 separates the inlet 22 side and the outlet 24 side. The partition wall portion 34 extends to the distal end on the front side where the inlet 22 and outlet 24 of the upper plate 30 are located, and extends to a point spaced a predetermined distance from the distal end on the rear side of the upper plate 30. The length through which the coolant flows is extended to twice or more than the length of the heat sink 20.

As the partition wall portion 34 is provided, the upper coolant flow path 32 is divided into an inlet-side flow path 32a, a connection part flow path 32b, and an outlet-side flow path 32c. The coolant flows into the inlet port 22 and passes through the inlet branch pipe 25, the inlet side flow path 32a, the connection part flow path 32b, the outlet side flow path 32c, and the water outlet side pipe 26, and then exits through the outlet port 24. will come out A plurality of collision pillars 36 are provided in the upper coolant flow path 32. The collision pillar 36 extends from the upper surface 30a to the lower surface 30b of the upper water tank 31 constituting the upper coolant flow path 32. (See FIG. 5)

The collision pillar 36 serves not only to transfer heat from the upper surface 30a of the upper plate 30 to the lower surface 30b, but also to collide with the coolant while flowing to generate vortex and mix heat dissipation (heat mixing) also do The collision pillars 36 are arranged to gradually become denser along the coolant flow path. In simple terms, "density of the collision pillars 36 of the inlet-side flow path 32a<density of the collision pillars 36 of the connection flow path 32b<density of the collision pillars 36 of the outlet-side flow path 32c" and are composed. Referring to FIG. 7, this configuration is clearly revealed. (Here, density means the number of units placed per unit area.)

Further, in the inlet-side flow path 32a, the density of the collision pillars 36 in the second half is higher than the density of the collision pillars 36 in the first half. On the other hand, in the outlet-side flow path 32c, the density of the collision pillars 36 in the first half is higher than the density of the collision pillars 36 in the latter half.

In this way, when the coolant flows along the upper coolant flow path 32, the density of the collision pillar 36 is relatively low in the inlet-side flow path 32a, so that the entry speed of the coolant occurs quickly, and the outlet-side flow path 32c In the collision pillar 36, the density is relatively high, so that heat mixing of the coolant occurs well.

Further, in the inlet-side flow path 32a, the density of the collision pillars 36 in the second half is higher than the density of the collision pillars 36 in the first half. On the other hand, in the outlet-side flow path 32c, the density of the collision pillars 36 in the first half is higher than the density of the collision pillars 36 in the latter half.

In this way, when the coolant flows along the upper coolant flow path 32, the density of the collision pillar 36 is relatively low in the inlet-side flow path 32a, so that the entry speed of the coolant occurs quickly, and the outlet-side flow path 32c. In the collision pillar 36, the density is relatively high, so that heat mixing of the coolant occurs well.

The collision pillars 36 are arranged in a staggered manner. That is, the n-th pillar and the n−1th pillar are arranged to cross each other when viewed from the front or top. This is to increase the chance of the coolant colliding with the collision pillar 36 so that mixing occurs well.

However, in the first half of the inlet-side flow path 32a, the collision pillars 36 are not alternately arranged, but are arranged uniformly. This is to avoid reducing the entry speed of the coolant.

On the other hand, a non-collision zone 32d in which the collision pillar 36 is not disposed is provided in the middle of the inlet-side flow path 32a or the middle of the outlet-side flow path 32c. This is to prevent stagnation by changing the flow rate of the coolant and to reinforce the speed at which the colliding pillar 36 enters the most dense area. This is also effective when a plurality of semiconductor elements are coupled to the upper or lower surface of the heat sink.

FIG. 9 shows a flow velocity distribution in the coolant flow path. In the inlet-side flow path 32a, coolant enters rapidly and mixed flow occurs in the second half, rotation occurs in the connection part flow path 32b, and various forms of mixed flow occur in the outlet-side flow path 32c.

FIG. 10 shows a streamline of coolant. Coolant flows along the upper coolant flow path 32 and hits the collision pillar 36 to show an 'S'-shaped meandering flow. That is, since the contact time with the cooling plate is increased while flowing in a meandering form rather than simply having a straight flow, and there are many opportunities for vortex generation, heat mixing of the coolant is well performed.

A support part 38 protrudes from the side of the upper plate 30. A fastening hole 39 is formed in the support part 38 and can be fixed by a fastening member or the like.

Connection supports 37 and 47 are provided between the upper plate 30 and the lower plate 40. An upper connection support part 37 (or first connection support part) is provided on the lower surface of the upper plate 30, and a lower connection support part 47 (or second connection support part) is provided on the upper surface of the lower plate 40. The upper connection support portion 37 and the lower connection support portion 47 are in contact with each other. The connection supports 37 and 47 not only support the upper plate 30 and the lower plate 40, but also serve as a heat exchange flow path between the upper plate 30 and the lower plate 40. Through-holes 35 and 45 are formed in the connection supports 37 and 47 so that air can flow.

According to the heat sink for power device according to the present embodiment, the coolant flow path is formed in a plate shape, so that the occupied space per unit area is increased. That is, the flow rate of the coolant flow path is formed in a planar shape, a coolant flow rate is increased in the unit volume compared to the prior art in which the coolant flow path is formed in a linear shape.

The cooling plates comprises two cooling plates spaced apart from each other by a predetermined distance, and are respectively responsible for cooling two adjacent power devices.

Since a ventilation layer is provided between the two cooling plates, both the water cooling type and the air cooling type are used.

A collision pillar is provided in the coolant flow path so that mixing occurs while forming a vortex in the coolant. That is, thermal mixing is well achieved.

Since the number (density) of collision pillar per unit area gradually increases from the inlet side to the outlet side, a decrease in the entry speed of the coolant is prevented at the inlet side, and heat mixing is well performed by mixed flow at the outlet side.

The coolant flow path is arranged close to the power device to increase the cooling effect.

A connection support is provided between the two cooling plates to support and transfer heat.

The embodiments described above are embodiments implementing the present disclosure, and various modifications and variations may be made to those skilled in the art without departing from the essential characteristics of the present disclosure. Therefore, the embodiments disclosed in the present disclosure are not intended to limit the technical idea of the present disclosure, but to explain, and the scope of the technical idea of the present disclosure is not limited by these embodiments. That is, the protection scope of the present disclosure should be construed according to the following claims, and all technical ideas within the equivalent range should be construed as being included in the scope of the present disclosure.

EXPLANATION OF CODE 10, 10A power device module
20 Heatsink
22 Inlet
24 Outlet
25 Inlet branch
26 Outlet branch pipe
30 Upper plate (first plate)
31 Upper tank (first tank)
32 Upper coolant flow path (first coolant flow path)
34 Partition wall portion
35,45 through hole
36 Collision pillar 37,47 Connection support
38 Support portion
39 Fastening hole
40 Lower plate (second plate)
41 Lower tank (second tank)
42 Lower coolant flow path (second coolant flow path)
49 Ventilation layer

The invention claimed is:

1. A heat sink for power device comprising:
a cooling plate having an inlet and an outlet,
wherein a water tank is formed in a plate shape inside the cooling plate and forms a coolant flow path connected to the inlet and the outlet,
wherein a plurality of collision pillars leadings to an upper surface and a lower surface of the water tank are formed in the water tank,
wherein the cooling plate comprises a first plate and a second plate spaced apart from each other at a predetermined interval,
wherein a connection support portion is provided between the first plate and the second plate,
wherein the connection support portion comprises;
a first connection support part provided on a lower surface of the first plate; and
a second connection support part provided on an upper surface of the second plate,
wherein the first connection support part and the second connection support part are in contact with each other.

2. The heat sink for power device of claim 1, wherein a ventilation layer is provided between the first plate and the second plate.

3. The heat sink for power device of claim 1, wherein a branch pipe branching to the first plate and the second plate is at each of a rear of the inlet and the outlet.

4. The heat sink for power device of claim 1, wherein one of an upper part and a lower part of a first water tank of the first plate disposed above the cooling plate is formed thinner than the other of the upper part and the lower part of the first water tank of the first plate, and
one of an upper part and a lower part of a second water tank of the second plate disposed below the cooling plate is formed thinner than the other of the upper part and the lower part of the second water tank of the second plate.

5. The heat sink for power device of claim 1, wherein the water tank is formed with a partition wall portion separating the coolant flow path into an inlet-side flow path and an outlet-side flow path.

6. The heat sink for power device of claim 1, wherein a density of the collision pillar is arranged to gradually become denser along the coolant flow path.

7. The heat sink for power device of claim 5, wherein a n-th of the collision pillar and a n–1-th of the collision pillar are arranged to cross each other when viewed from a front or top.

8. The heat sink for power device of claim 7, wherein the n-th of the collision pillar and the n–1-th of the collision pillar are disposed uniformly without crossing each other in a front portion of the inlet-side flow path.

9. The heat sink for power device of claim 5, wherein a non-collision zone in which the collision pillar is not disposed is provided in a middle portion of the outlet-side flow path.

10. The heat sink for power device of claim 1, wherein a support portion protrudes from a side surface of the cooling plate, and a fastening hole is formed through the support portion.

11. The heat sink for power device of claim 1, wherein a through-hole is formed in the connection support portion.

* * * * *